(12) United States Patent
Park et al.

(10) Patent No.: US 10,295,643 B2
(45) Date of Patent: May 21, 2019

(54) MAGNETIC RESONANCE IMAGING APPARATUS AND CONTROL METHOD

(71) Applicants: SAMSUNG ELECTRONICS CO., LTD., Suwon-si (KR); Korea Advanced Institute of Science and Technology, Daejeon (KR)

(72) Inventors: Hyun Wook Park, Daejeon (KR); Yong Wan Lim, Daejeon (KR); Ye Ji Han, Daejeon (KR)

(73) Assignees: SAMSUNG ELECTRONICS CO., LTD., Suwon-si (KR); KOREA ADVANCED INSTITUTE OF SCIENCE AND TECHNOLOGY of Korea, Daejeon (KR)

(*) Notice: Subject to any disclaimer, the term of this patent is extended or adjusted under 35 U.S.C. 154(b) by 973 days.

(21) Appl. No.: 14/804,678

(22) Filed: Jul. 21, 2015

(65) Prior Publication Data
US 2016/0018497 A1   Jan. 21, 2016

(30) Foreign Application Priority Data
Jul. 21, 2014 (KR) .................. 10-2014-0091888

(51) Int. Cl.
*G01R 33/567* (2006.01)
*G01R 33/48* (2006.01)

(52) U.S. Cl.
CPC ........ *G01R 33/567* (2013.01); *G01R 33/4818* (2013.01); *G01R 33/5673* (2013.01); *G01R 33/5676* (2013.01)

(58) Field of Classification Search
USPC .................. 324/300–322; 600/407–435; 382/128–131
See application file for complete search history.

(56) References Cited

U.S. PATENT DOCUMENTS

| | | | |
|---|---|---|---|
| 4,727,882 A | 3/1988 | Schneider et al. | |
| 6,268,730 B1* | 7/2001 | Du ..................... | G01R 33/5676 324/309 |
| 2007/0038071 A1* | 2/2007 | Nauerth ............. | G01R 33/5676 600/410 |

(Continued)

OTHER PUBLICATIONS

Jonathan Bishop et al., Retrospective Gating for Mouse Cardiac MRI, 55 Magnetic Resonance in Medicine 472-77 (2006).*

(Continued)

*Primary Examiner* — Tung X Nguyen
*Assistant Examiner* — Robert P Alejnikov, Jr.
(74) *Attorney, Agent, or Firm* — Sughrue Mion, PLLC

(57) ABSTRACT

A magnetic resonance imaging (MRI) apparatus and a control method thereof are provided. The MRI apparatus includes a scanner, and a controller configured to control the scanner to receive magnetic resonance (MR) signals corresponding to a magnitude of a y-axis gradient magnetic field in a respiration cycle of a patient, each of the MR signals being received at a time interval equal to a time period of the respiration cycle over a number of the received MR signals. The MRI apparatus further includes a processor configured to extract an MR signal received in a respiration condition of the patient from the received MR signals, fill a k-space with the extracted MR signal, and generate an MR image by reconstructing data of the filled k-space.

18 Claims, 22 Drawing Sheets

(56) References Cited

U.S. PATENT DOCUMENTS

| | | | | |
|---|---|---|---|---|
| 2009/0278539 A1* | 11/2009 | Beatty | .................... | A61B 5/055 |
| | | | | 324/312 |
| 2012/0112751 A1* | 5/2012 | Littmann | ............... | A61B 5/055 |
| | | | | 324/322 |
| 2012/0319685 A1* | 12/2012 | Burger | ............... | G01R 33/5676 |
| | | | | 324/309 |
| 2013/0006096 A1 | 1/2013 | Madore | | |

OTHER PUBLICATIONS

Peng Lai et al., A Dual-Projection Respiratory Self-Gating Technique for Whole-Heart Coronary MRA, 28 J. Magnetic Resonance Imaging 612-620 (2008).*

Communication dated Mar. 19, 2018, from the European Patent Office in counterpart European Application No. 15824202.4.

Yongwan Lim et al. "A Robust Free-breathing Data Acquisition Method for Reduction of Respiratory Motion Artifacts" Proceedings of the International Society for Magnetic Resonance in Medicine, May 10-16, 2014 (p. 4368), XP040671141.

Communication dated Oct. 21, 2015 issued by International Searching Authority in counterpart International Patent Application No. PCT/KR2015/007563.

Bishop et al., "Retrospective Gating for Mouse Cardiac MRI", Magnetic Resonance in Medicine 55:472-477, Jan. 31, 2006, 6 pages total, Wiley InterScience, www.interscience.wiley.com.

* cited by examiner

MAGNETIC RESONANCE IMAGING APPARATUS AND CONTROL METHOD

CROSS-REFERENCE TO RELATED APPLICATION

This application claims priority from of Korean Patent Applications No. 10-2014-0091888, filed on Jul. 21, 2014, in the Korean Intellectual Property Office, the disclosure of which is incorporated herein by reference in its entirety.

BACKGROUND

1. Field

Apparatuses and methods consistent with exemplary embodiments relate to a magnetic resonance imaging apparatus and a control method thereof.

2. Description of the Related Art

In general, medical imaging apparatuses are apparatuses that acquire information on a patient and provide an image. Among the medical imaging apparatuses, magnetic resonance imaging apparatuses play a role in fields using medical imaging because they have relatively free image capture conditions and provide excellent contrast in soft tissues and various diagnostic information images.

It is a principle that a patient holds his/her breath during magnetic resonance imaging (MRI) scanning. However, there are cases where the patient does not fulfill this, and when the imaging sequence takes a long time, it may be actually impossible to hold a breath throughout the MRI scanning.

Because data, which is acquired while the patient takes breath, constitutes k-space, an artifact may be generated in an MR image acquired by reconstructing the data. The method to reduce the artifact includes prospective gating and retrospective gating, both of which are methods to reconstruct an image based on data in the same respiration condition by using a feature that respiration is repeated periodically.

SUMMARY

Exemplary embodiments address at least the above problems and/or disadvantages and other disadvantages not described above. Also, the exemplary embodiments are not required to overcome the disadvantages described above, and may not overcome any of the problems described above.

Exemplary embodiments provide a magnetic resonance imaging apparatus configured to improve an efficiency of acquisition data, and configured to reduce an influence of patient respiration by randomly determining a number and an order of the acquisition data in consideration of a respiration cycle of a patient when determining data to be filled k-space after acquiring the data, and a control method thereof.

In accordance with one aspect of the present disclosure, a magnetic resonance imaging (MRI) apparatus includes a scanner forming a X-axis gradient magnetic field, a Y-axis gradient magnetic field, and a Z-axis gradient magnetic field in a bore, and acquiring an MR signal generated by a patient placed in the bore, a data storage storing k-space data including a plurality of ky lines filled with the received MR signal, and a sequence controller controlling the scanner to acquire N (N is an integer of 2 or more) MR signal for the same Y axis gradient magnetic field in a single respiration cycle $T_{resp}$ of the patient at the same interval $T_{resp}/N$.

The sequence controller may control the scanner to further acquire an MR signal for a plurality of Y axis gradient magnetic field having a different magnitude from the same Y-axis gradient magnetic field in the single respiration cycle $T_{resp}$.

The plurality of Y axis gradient magnetic field corresponding to MR signal acquired in the single respiration cycle $T_{resp}$ may have a difference equal to or larger than a reference magnitude to each other.

The sequence controller may control the number of MR signal, which is acquired in the single respiration cycle, to be variable according to a magnitude of the Y-axis gradient magnetic field.

The sequence controller may increase the number of MR signal acquired in the single respiration cycle as a magnitude of the Y-axis gradient magnetic field is small.

The sequence controller may control the number of MR signal acquired in the single respiration cycle to be inversely proportion to a magnitude of the Y-axis gradient magnetic field.

The sequence controller may keep a Repetition Time (TR) to be constant.

The MRI apparatus may further include a data processor filling the k-space by extracting an MR signal acquired in a certain respiration condition of the patient from the acquired MR signal.

The data processor may extract an MR signal acquired in a certain respiration condition of the patient based on the respiration information of the patient measured while acquiring the MR signal.

The respiration information of the patient may be acquired by at least one of respiratory bellows method, Navigator echo method, and self navigator method.

The data processor may classify the acquired MR signal according to a plurality of respiration conditions, and may generate k-space data corresponding to a plurality of respiration conditions by filling k-space corresponding to the plurality of respiration conditions with the classified MR signal.

The MRI apparatus may further include an image processor generating an MR image corresponding to the plurality of respiration conditions by reconstructing k-space data corresponding to the plurality of respiration conditions by using an image reconstruction technique applicable to a compressive sensing.

A number n may have a value equal to or more than 5 and equal to 10 or less than 10.

In accordance with one aspect of the present disclosure, a control method of a magnetic resonance imaging (MRI) apparatus acquiring an MR signal by changing a magnitude of a Y-axis gradient magnetic field, includes acquiring N (N is an integer of 2 or more) MR signal for the same Y axis gradient magnetic field in a single respiration cycle $T_{resp}$ of the patient at the same interval $T_{resp}/N$, filling k-space by extracting an MR signal acquired in a certain respiration condition of the patient from the acquired MR signal, and generating an MR image by reconstructing k-space data filled with the extracted MR signal.

The control method may further include acquiring an MR signal for a plurality of Y-axis gradient magnetic field having a different magnitude from the same Y-axis gradient magnetic field in the single respiration cycle $T_{resp}$.

The plurality of Y-axis gradient magnetic field according to an MR signal acquired in the single respiration cycle $T_{resp}$ have a difference equal to or larger than a reference magnitude to each other.

The control method may further include controlling the number of number of MR signal, which is acquired in the single respiration cycle, to be variable according to a magnitude of the Y-axis gradient magnetic field.

The controlling of the number of number of MR signal, which is acquired in the single respiration cycle, to be variable according to a magnitude of the Y-axis gradient magnetic field may include increasing the number of MR signal acquired in the single respiration cycle as a magnitude of the Y-axis gradient magnetic field is small.

The controlling of the number of number of MR signal, which is acquired in the single respiration cycle, to be variable according to a magnitude of the Y-axis gradient magnetic field may include controlling the number of MR signal, which is acquired in the single respiration cycle, to be inversely proportion to a magnitude of the Y-axis gradient magnetic field.

The filling of k-space by extracting an MR signal acquired in a certain respiration condition of the patient from the acquired MR signal may include classifying the acquired MR signal according to a plurality of respiration conditions, and generating k-space data according to a plurality of respiration conditions by filling k-space according to the plurality of respiration conditions with the classified MR signal.

The generating of an MR image by reconstructing k-space data filled with the extracted MR signal may include generating an MR image according to the plurality of respiration conditions by reconstructing k-space data according to the plurality of respiration conditions by using an image reconstruction technique applicable to a compressive sensing.

BRIEF DESCRIPTION OF THE DRAWINGS

The above and/or other aspects will be more apparent by describing certain exemplary embodiments with reference to the accompanying drawings in which.

DETAILED DESCRIPTION OF THE EXEMPLARY EMBODIMENTS

Figure 1:
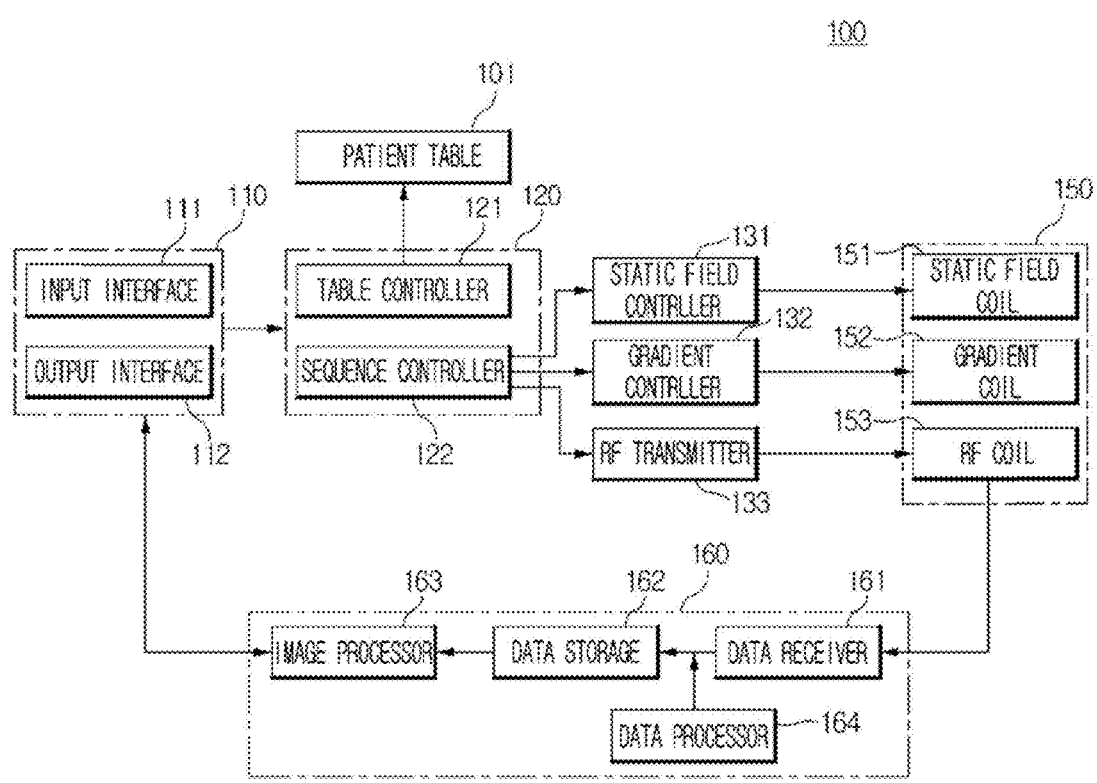
FIG. 1 is a control block diagram of an MRI apparatus according to an exemplary embodiment.

Exemplary embodiments are described in greater detail herein with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

In addition, the terms such as "unit," "-er (-or)," and "module" described in the specification refer to an element for performing at least one function or operation, and may be implemented in hardware, software, or the combination of hardware and software.

FIG. 1 is a control block diagram of an MRI apparatus according to an exemplary embodiment.

Referring to FIG. 1, an MRI apparatus 100 includes a scanner 150 forming a magnetic field and receiving an MR signal generated by a patient, a controller 120 controlling the operation of the scanner 150, and a processor 160 generating an MR image by various processing to an MR signal.

The scanner 150 includes a static field coil 151 forming a static magnetic field in a bore thereof, a gradient coil 152 generating gradients in the static magnetic field and thus forming gradient magnetic fields, and a radio frequency (RF) coil 153 exciting atomic nuclei by applying an RF pulse and receiving an echo signal from the atomic nuclei.

The MRI apparatus 100 further includes a patient table 101 transmitting a patient to the bore. The controller 120 includes a table controller 121 controlling the movement of the patient table 101, and a sequence controller 122 configuring a pulse sequence or controlling operations of the scanner 150 according to a pulse sequence. The table controller 121 and the sequence controller 122 may be realized by a single processor or a separated processor.

The sequence controller 122 controls the strength and a direction of a static field generated by the static field coil 151, configures a pulse sequence that is appropriate for the purpose of diagnosis and the diagnosis part in a patient, and then controls the gradient coil 152 and the RF coil 153 according to the configured pulse sequence. In addition, an acquiring data of the scanner 150, which will be described later, is controlled by the sequence controller 121.

The MRI apparatus 100 further includes a static field controller 131 applying a static field current to the static field coil 151 to generate a static field, a gradient controller 132 applying a gradient current to the gradient coil 152 to generate a gradient field, and an RF transmitter 133 transmitting an RF signal to the RF coil 153.

The pulse sequence controller 122 controls the static field coil 151, the gradient coil 152, and the RF coil 153 through the static field controller 131, the gradient controller 132, and the RF transmitter 133 to control a static field, a gradient field both of which are generated in the bore, and RF applied to a patient.

The RF coil 153 is connected to the RF transmitter 133 and the processor 160. The processor 160 includes a data receiver 161 collecting data an MR signal received by the RF coil 153, and converting into processable data, a data storage 162 storing k-space data, an image processor 163 reconstructing an MR image by using the k-space data, and a data processor 164 filling the k-space by classifying MR signals according to the respiratory condition of a patient.

The data receiver 161 may include a pre-amplifier amplifying the MR signal received by the RF coil 153, a phase detector receiving the MR signal transmitted from the pre-amplifier and then detecting a phase, and an A/D converter converting an analog signal acquired through phase detection into a digital signal.

The data receiver 161 transmits the MR signal converted into the digital signal to the data storage 162. A mathematical space storing MR data is formed in the data storage 162, in which the mathematical space represents k-space. For example, the k-space may be a two-dimensional (2D) Fourier space.

When the MR data is filled in the k-space of the data storage 162, and k-space data is completed, the image processor 163 may generate an MR image by applying various image reconstruction techniques. For example, an image may be reconstructed by applying an inverse Fourier transform upon the k-space data.

The data processor 164 may fill the k-space of the data storage 162 by extracting data, which is assumed to be acquired in a respiratory condition of a patient, among the acquired MR data in the data receiver 161. This is referred to as "retrospective gating".

Another storage, in which k-space data corresponding to entire MR data acquired in the data receiver 161 is stored, may be provided between the data receiver 161 and the data storage 162. At this time, the data processor 164 stores new k-space data in the data storage 162 by classifying ky lines included in the k-space data according to the respiratory condition of a patient.

Exemplary embodiments, which will be described later, include a case when data classified or determined by the data processor 164 is MR data transmitted from the data receiver 161, and a case when data classified or determined by the data processor 164 is ky lines filed with the MR data. Therefore, data corresponding to ky line may be data acquired about a Y-axis gradient magnetic field corresponding to the ky line, or data filled in the ky lines already.

The MRI apparatus further includes a user interface 110 provided with an input interface 111 and an output interface 112. A command of control of entire operations of the MRI apparatus 100 may be inputted from a user through the input interface 111. When receiving a command related to an imaging technique of an MRI image or a pulse sequence from a user, the sequence controller 122 may configure a pulse sequence according to the received command.

The output interface 112 may display various information related to the control of the MRI apparatus 100 and an MRI image generated by the image processor 163.

The input interface 111 may employ at least one of various input devices, such as a key board, a mouse, a track ball, a key pad, and a touch pad. The output interface 112 may employ at least one of various display devices, such as Liquid Crystal Display (LCD), Light Emission Display (LED), Organic Light Emission Display (OLED), Plasma Display Panel (PDP), and Cathode Ray Tube (CRT).

In addition, the input interface 111 and the output interface 112 may be realized by a touch screen when a touch panel is disposed on the front of a display.

The user interface 110 may be provided in a workstation or a host device of the MRI apparatus 100.

Because components of the processor 160 are not formed by a single physical component, a portion or all of the components of the processor 160 may be included in a workstation.

Figure 2:
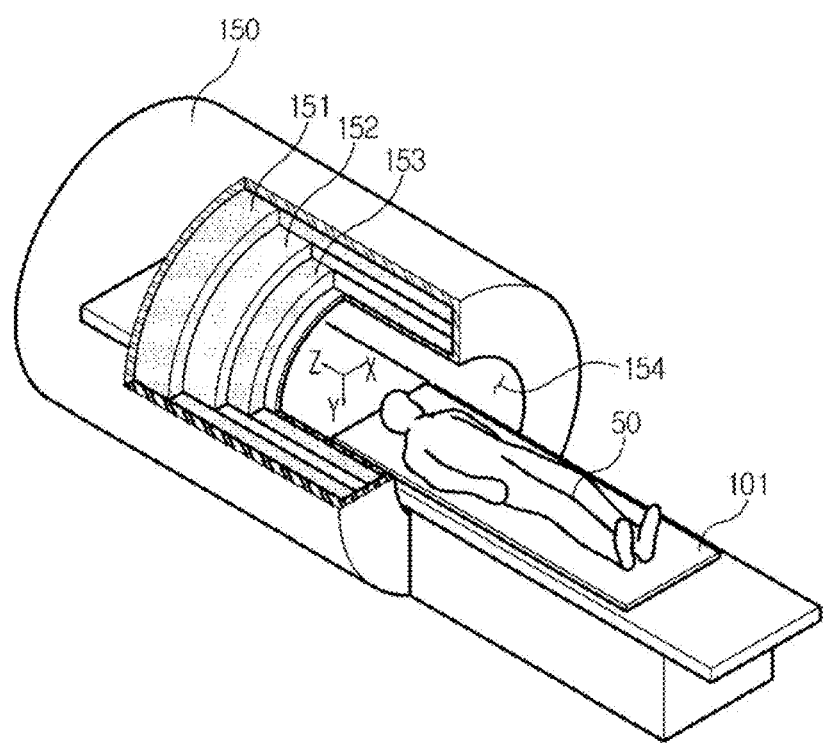
FIG. 2 is a view schematically illustrating an external appearance of an MRI apparatus according to an exemplary embodiment.
Figure 3:
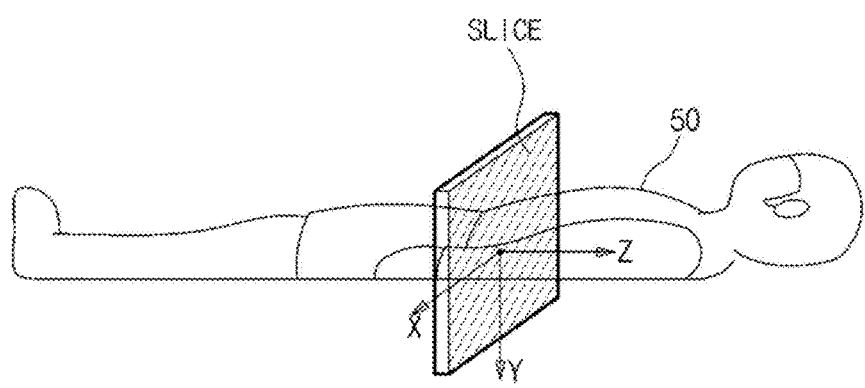
FIG. 3 is a view illustrating an object along X, Y and Z axes according to an exemplary embodiment.
Figure 4:
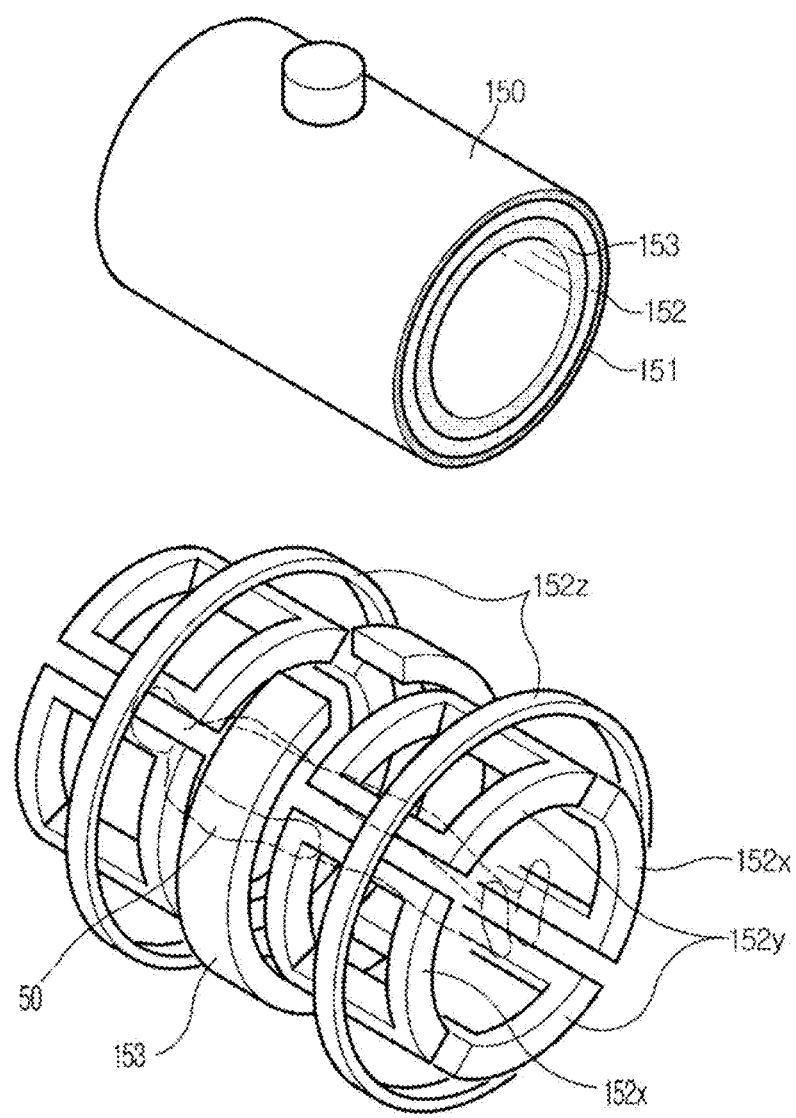
FIG. 4 is a view illustrating a structure of a scanner and a gradient coil unit according to an exemplary embodiment.

FIG. 2 is a view schematically illustrating an external appearance of an MRI apparatus according to an exemplary embodiment, FIG. 3 is a view illustrating an object along X, Y and Z axes according to an exemplary embodiment, and FIG. 4 is a view illustrating a structure of a scanner and a gradient coil unit according to an exemplary embodiment.

Hereinafter detailed operations of the MRI apparatus will be described with reference to FIG. 1 illustrated above.

Referring to FIG. 2, the scanner 150 is formed in a shape of a cylinder having an empty inner space, and may be referred to as a gantry. The inner space of the scanner 150 may be referred to as a cavity or a bore, a void formed in the scanner 150 is referred to as a bore 154.

The patient table 101 transmits a patient 50 placed thereon to the bore 154. When a user manipulates the input interface 111 to input a command related to a position of the patient table 101, the table controller 121 may move the patient table 101 to a desired position.

The static field coil 151, the gradient coil 152, and the RF coil 153 are embedded inside the scanner 150.

The static field coil 151 includes a coil configured to generate a static field in the bore, and may be referred to as 'main magnet'. The main magnet may be realized by a superconducting magnet. In this case, the static field coil 151 may include a superconducting coil.

The static field coil 151 may be formed in a shape in which a coil is wound around the bore, and when current is applied from the static field controller 131 to the static field coil 151, a static magnetic field having a magnitude is formed in the bore 154. The direction of the static magnetic field may be parallel to the longitudinal axis of the scanner 150.

When the static magnetic field is formed in the bore 154, atomic nuclei of atoms constituting the patient 50, e.g., hydrogen atoms, are arranged in the direction of the static magnetic field and execute precession in the direction of the static magnetic field. The precession speed of atomic nuclei may be represented as a precession frequency, and such a precession frequency may be referred to as a Larmor frequency and expressed by Equation 1 below.

$$\omega = \gamma B_0 \qquad \text{[Equation 1]}$$

Here, $\omega$ is a Larmor frequency, $\gamma$ is a proportional constant, and $B_0$ is the intensity of an external magnetic field. The proportional constant varies according to kinds of atomic nuclei, the intensity of an external magnetic field is measured in tesla (T) or gauss (G), and a precession frequency is measured in Hz.

For example, hydrogen protons have a precession frequency of 42.58 MHz in the external magnetic field of 1 T and, among elements constituting a human body, hydrogen occupies the largest percentage. Thus an MR signal is acquired predominantly using precession of hydrogen protons during MRI.

As illustrated in FIG. 3, when a longitudinal axis of the patient 50 is parallel to a longitudinal axis of the scanner 150, an axis parallel to a longitudinal axis from the head to the feet of the patient 50, i.e., an axis parallel to the direction of the static magnetic field, is defined as the Z-axis, an axis parallel to the lateral direction of the patient 50 is defined as the X-axis, and an axis parallel to the vertical direction in the space or the scanner 150 is defined as the Y-axis.

When the longitudinal axis of the patient 50 is placed in parallel to the direction of the static field, a tomography image of a cross section of the patient may be acquired, and a slice having a thickness may be selected to acquire the tomography image.

To acquire three dimensional (3D) spatial information of the MR signal, gradient magnetic fields in all directions of the X-axis, Y-axis and Z-axis are generated. For example, the gradient coil 152 includes three pairs of gradient coils corresponding to the X-, Y-, and Z-axes.

As illustrated in FIG. 4, Z-axis gradient coils 152z include a pair of ring type coils, and Y-axis gradient coils 152y are located above and below the patient 50. Further, X-axis gradient coils 152x are located at the left and right sides of the patient 50.

As illustrated later, the Z-axis gradient coils 152z are used to select a slice, the Y-axis gradient coils 152y are used for phase encoding, and the X-axis gradient coils 152x are used for frequency encoding.

Figure 5:
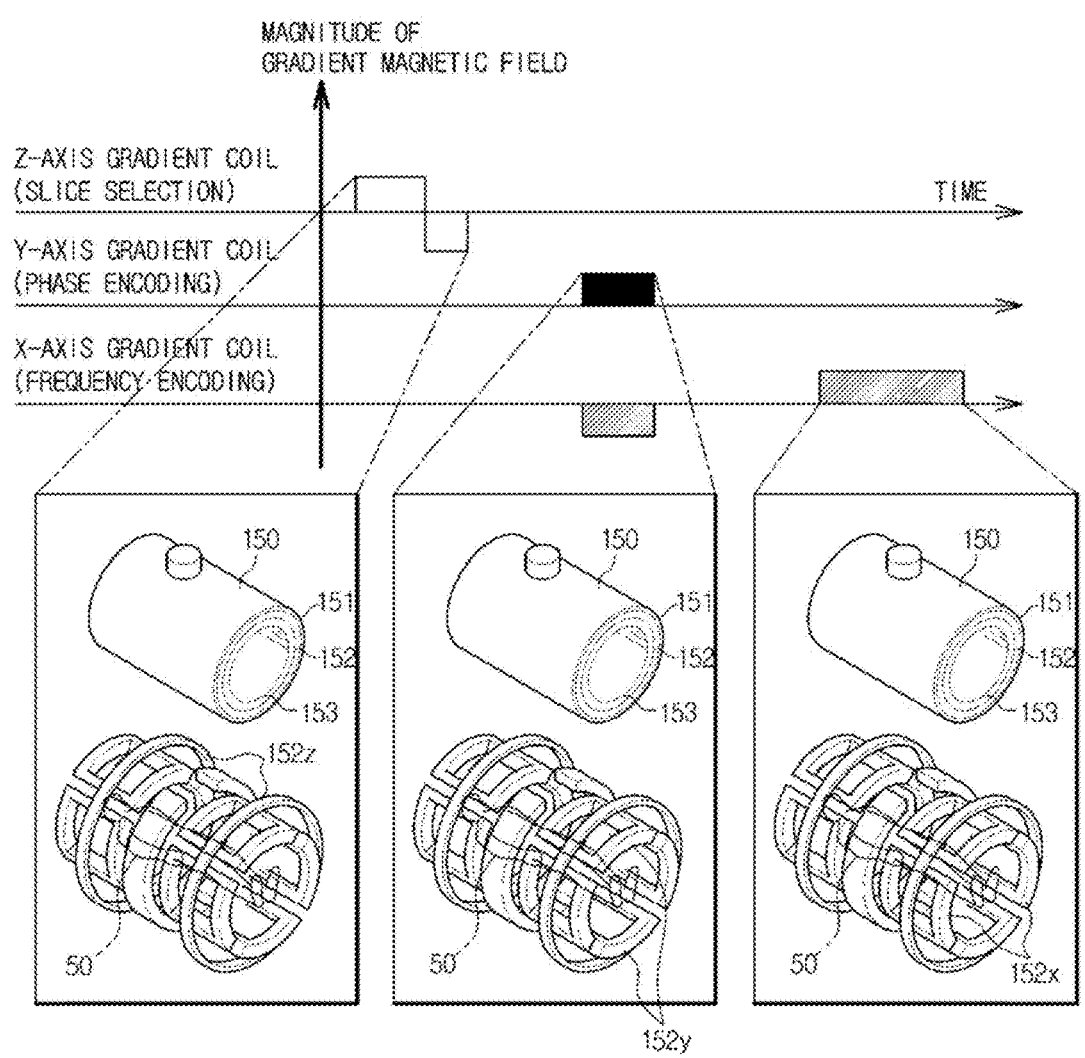
FIG. 5 is a diagram illustrating a pulse sequence regarding operations of gradient coils according to an exemplary embodiment.

FIG. 5 is a diagram illustrating a pulse sequence regarding operations of gradient coils according to an exemplary embodiment.

When direct currents having opposite polarities flow in the two Z-axis gradient coils 152z in opposite directions, the magnetic field is changed in the Z-axis direction and thus a gradient magnetic field is formed. When the gradient magnetic field is formed by flow of current along the Z-axis gradient coils 152z for a predetermined period of time, the resonance frequency is changed to a higher frequency or a lower frequency according to the magnitude of the gradient magnetic field. Then, when an RF signal corresponding to a position is applied through the RF coil 153, only protons of a slice corresponding to the position resonate. Therefore, the Z-axis gradient coils 152z are used in slice selection. As a gradient of the gradient magnetic field formed in the Z-axis direction is increased, a slice having a smaller thickness may be selected. When the slice is selected through the gradient magnetic field formed by the Z-axis gradient coils 152z, all spins constituting the slice have the same frequency and the same phase and thus the respective spins are indistinguishable from one another.

At this time, when a Y-axis gradient magnetic field is formed by the Y-axis gradient coils 152y, the gradient magnetic field causes phase shift so that rows of the slice have different phases. That is, when the Y-axis gradient magnetic field is formed, the phase of the spins of the row to which a large gradient magnetic field is applied is changed to a higher frequency, and the phase of the spins of the row to which a small gradient magnetic field is applied is changed to a lower frequency. When the Y-axis gradient magnetic field is removed, phase shift of the respective rows of the selected slice occurs and thus the rows have different phases. Thus, the rows may be distinguished from one another. As described above, the gradient magnetic field formed by the Y-axis gradient coils 152y is used in phase encoding.

The slice is selected through the gradient magnetic field formed by the Z-axis gradient coils 152z, and the rows constituting the selected slice are distinguished from one another by different phases thereof through the gradient magnetic field formed by the Y-axis gradient coils 152y. However, the respective spins constituting each row have the same frequency and the same phase, and are thus indistinguishable from one another.

At this time, when a gradient magnetic field in the X-axis direction is formed by the X-axis gradient coils 152x, the X-axis gradient magnetic field causes the spins constituting each row to have different frequencies so that the respective spins are distinguishable from one another. As described above, the gradient magnetic field formed by the X-axis gradient coils 152x is used in frequency encoding.

As described above, the gradient magnetic field formed by the Z-axis, Y-axis and X-axis gradient coils execute encoding of spatial positions of the respective spins, i.e., spatial encoding, through slice selection, phase encoding, and frequency encoding.

Referring again to FIG. 1, the gradient coil 152 is connected to the gradient controller 132, and the gradient controller 132 applies a gradient waveform, i.e., a current pulse, to the gradient coil 152 according to a control signal transmitted from the pulse sequence controller 122 and then generates a gradient magnetic field. Therefore, the gradient controller 132 may be referred to as a gradient power supply, and may include three drive circuits corresponding to the three pairs of gradient coils 152x, 152y and 152z of the gradient coil 152.

The gradient controller 132 may include a waveform generator generating a gradient waveform (current pulse) according to a pulse sequence configured by the sequence controller 122, and a gradient amplifier amplifying the generated gradient waveform and transmitting the amplified gradient waveform to the gradient coil 152.

As described above, atomic nuclei arranged by the external magnetic field execute precession at the Larmor frequency, and the magnetization vector sum of several atomic nuclei may be represented as net magnetization M. Measurement of a Z-axis component of the net magnetization M may be impossible, and thus only $M_{XY}$ may be detected. Therefore, to acquire an MR signal, the net magnetization may be on the X-Y plane through excitation of the atomic nuclei. To excite the atomic nuclei, an RF pulse tuned to the Larmor frequency of the atomic nuclei may be applied.

The RF coil 153 may include a transmission coil transmitting the RF pulse, and a reception coil receiving electromagnetic waves emitted from the excited atomic nuclei, i.e., an MR signal. Alternatively, the RF coil 153 may use a coil executing both transmission and reception, such as a head coil, instead of the transmission coil and the reception coil.

The RF coil 153 is connected to the RF transmitter 133, and the RF transmitter 133 may include a modulation circuit modulating an RF signal into a pulse type signal, and an RF power amplifier amplifying the pulse type signal. As mentioned above, because the MR signal received by the RF coil 153 is transmitted to the data receiver 161, the RF controller 133 and the data receiver 161 may be formed by a single RF transmission/reception module.

As a method to acquire an MR signal from atomic nuclei, a spin echo pulse sequence may be used. For example, the scanner 150 may acquire an MR signal according to a spin echo pulse sequence. Hereinafter detailed description thereof will be described.

Figure 6:
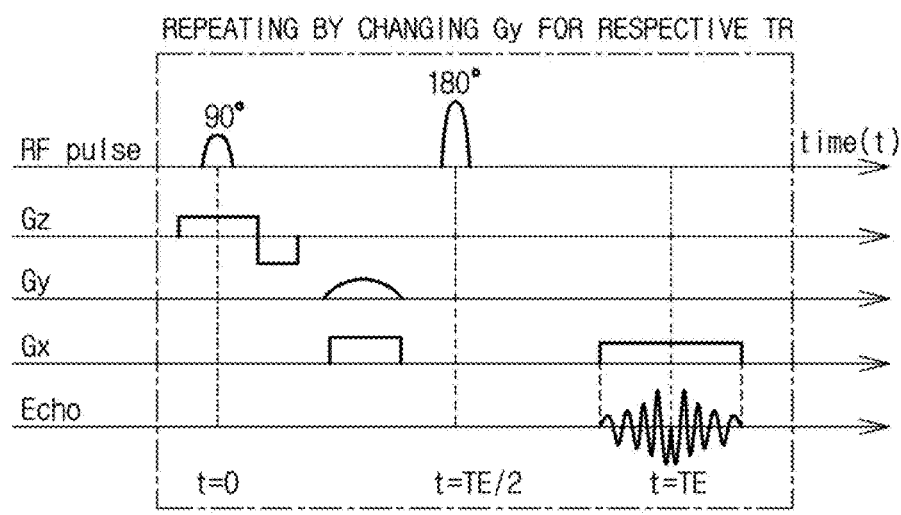
FIG. 6 is a diagram illustrating a pulse sequence diagram when a spin echo pulse sequence is used according to an exemplary embodiment.

FIG. 6 is a diagram illustrating a pulse sequence diagram when a spin echo pulse sequence is used according to an exemplary embodiment.

When applying a RF pulse, firstly the RF coil 153 may apply a RF pulse (hereinafter, referred to as excitation RF) for the excitation of atomic nuclei. When the excitation RF is applied, dephasing may occur due to the unbalance of magnetic field, and the interaction between spins and Free Induction Decay (FID) signal, which is rapidly reduced, may be generated.

Therefore, when applying refocusing RF configured to refocus dephased spins to acquire a signal in a stable state, an echo signal, which is a refocused FID signal in a stable state, that is an MR signal, may appear. This is referred to as a spin echo pulse sequence, and a period of time, which is used to generate an MR signal after the excitation RF is applied, may be defined as TE (Echo Time).

A period of time from when the excitation RF is applied to when the refocusing RF is applied may be represented by Δt. When Δt is expired from when the refocusing RF is applied, an MR signal may be generated. Therefore, an equation of TE=2Δt is valid.

A flip degree of protons may be represented as an angle to which the protons move from the axis where the protons are located before flip, and be represented as a 90 degree RF, a 180 degree RF, etc. according to the flip degree of the protons. In the spin echo pulse sequence, the excitation RF is mainly set to a 90 degree RF, and the refocusing RF is a 180 degree RF.

Referring to FIG. 6, when a 90 degree RF and a 180 degree RF are applied, a Z-axis gradient magnetic field Gz is generated by applying a gradient current to the Z-axis gradient coils 152z to select a slice subject to imaging. As illustrated in FIG. 6, the gradient current is applied in a pulse shape.

In addition, a Y-axis gradient magnetic field Gy is generated and then used for phase encoding, and a X-axis gradient magnetic field Gx is generated and then used for frequency encoding.

When the X-axis gradient magnetic field Gx is applied, an echo signal is generated form atomic nuclei. In this case, the echo signal is an MR signal. The generated echo signal includes location information in the X- and Y-axes. Therefore, signals acquired by the Y-axis gradient magnetic field and the X-axis gradient magnetic field may fill a k-space which is a 2 dimensional space formed by a kx axis and a ky axis.

Meanwhile, echo signals may be acquired by changing a magnitude of the Y-axis gradient magnetic field to acquire a single tomographic image. A gap between a time of when a 90 degree RF is applied to acquire an echo signal and a time of when a 90 degree RF is applied to acquire a next echo signal is a Repetition Time (TR).

Figure 7:
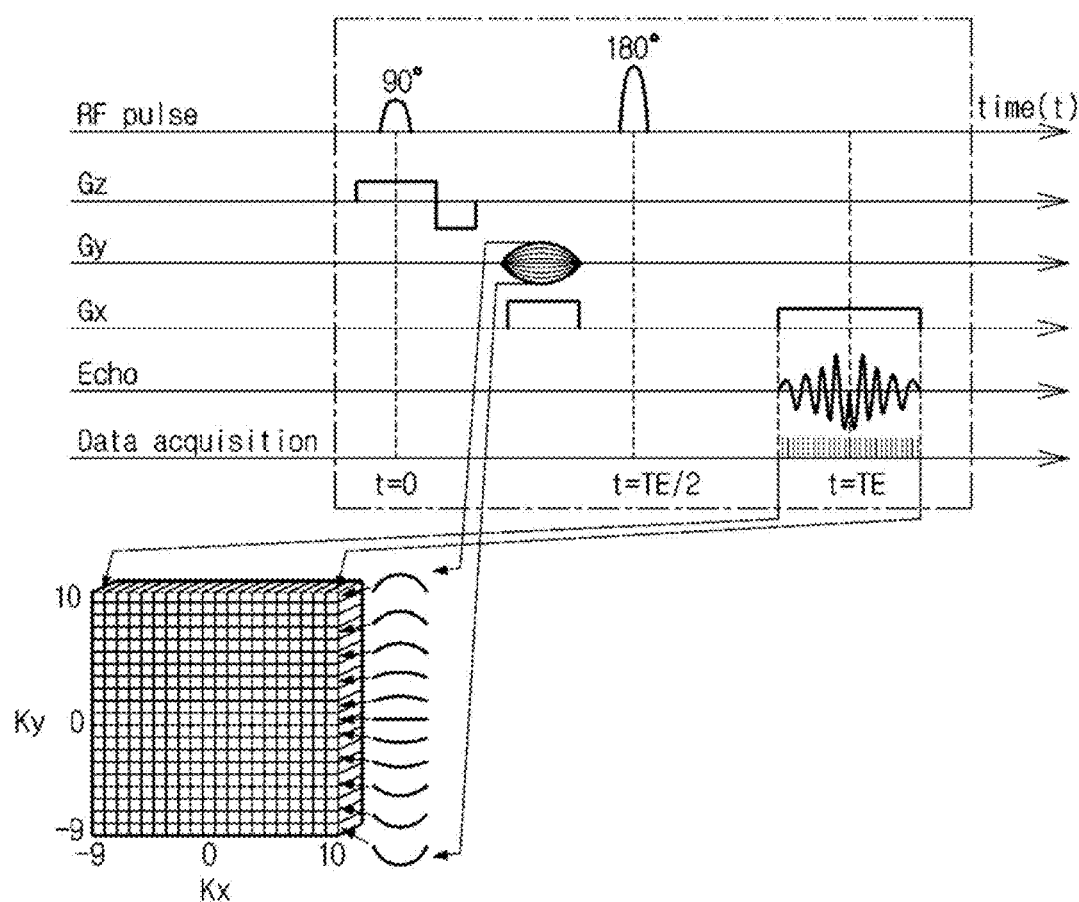
FIG. 7 is a diagram illustrating a relation between echo signals, which are acquired in a plurality of times by varying a magnitude of a Y-axis gradient magnetic field, and a k-space according to an exemplary embodiment.

FIG. 7 is a diagram illustrating a relation between echo signals, which are acquired in a plurality of times by varying a magnitude of a Y-axis gradient magnetic field, and a k-space, accordingly to an exemplary embodiment.

As mentioned above, when a k-space is formed in the data storage 162 and the k-space is filled with data, k-space data may be completed. The k-space, as illustrated in FIG. 7, is a two dimensional space formed by a kx axis and a ky axis, the kx axis is a frequency direction, and the ky axis is a phase direction.

For example, as illustrated in FIG. 7, when acquiring echo signals about 20 Y-axis gradient magnetic fields, which are different from each other in magnitude, the ky axis includes 20 horizontal lines, that is, 20 ky lines, and an echo signal about a respective Y-axis gradient magnetic field fills a single ky line. Therefore, when the echo signals about the 20 Y-axis gradient magnetic fields, which are different from each other, are acquired, and then the 20 ky lines are filled, data of the single k-space is completed.

When the data of the single k-space is reconstructed, a single MR image is acquired. When a patient takes a breath during an MRI (hereinafter referred to as scan), data acquired in different respiratory conditions from each other may fill a single k-space, and thus an artifact may be generated in an MR image acquired by reconstructing data of the k-space.

As a method to reduce an artifact caused by the breath, a prospective gating and a retrospective gating may be used. The prospective gating is a method of acquiring an MR signal in a respiratory condition while scanning and monitoring a respiratory condition of a patient in real time. Hereinafter, detailed description thereof will be described with reference to FIG. 8.

Figure 8:
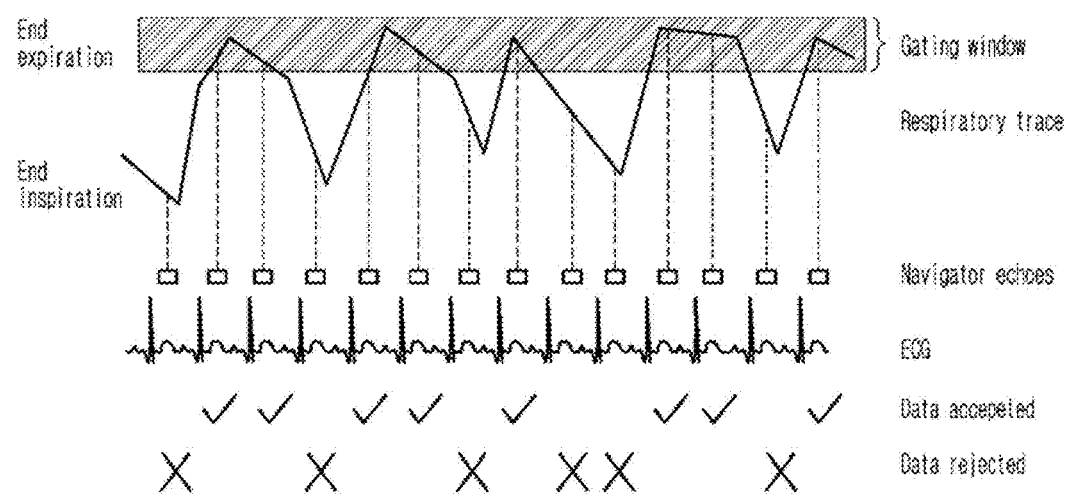
FIG. 8 is a diagram illustrating a process of acquiring an echo signal in a prospective gating method.

FIG. 8 is a diagram illustrating a process of acquiring an echo signal in a prospective gating method.

A duration of respiration has characteristics in which an end expiration is longer than another respiratory condition. Therefore, when an acquisition time of an echo signal is set to the end expiration, the echo signal may be acquired for a longer time.

Referring to FIG. 8, a patient's respiration is traced by using a navigator echo method among various methods for measuring respiration information, and an echo signal is acquired only when a respiratory condition of a patient is in an allowable range, which is a gating window corresponding to an end expiration.

In a case of the prospective gating method, because whether to acquire an echo signal is determined by monitoring a patient respiration and a series of processes for acquiring the echo signal is performed in real-time, a high-speed operation speed is used.

A retrospective gating method is a method to determine data used for an image reconstruction after repeatedly acquiring an echo signal, which corresponds to a respective ky line of a ky space, many times. Therefore, in a case of the retrospective gating method, a high-speed operation is not required. However, when acquiring an echo signal, a respiratory condition of a patient is not reflected, and thus an acquisition efficiency of valid data may be low.

According to an exemplary embodiment, the MRI apparatus 100 may determine data used for an image reconstruction after repeatedly acquiring an echo signal, which corresponds to a respective ky line, many times according to a retrospective gating method, and may determine an acquisition number and an order of echo signals in consideration of a respiratory cycle of a patient so that an acquisition efficiency of valid data may be increased and an image in which an effect caused by a respiration of the patient may be reduced.

Figure 9:
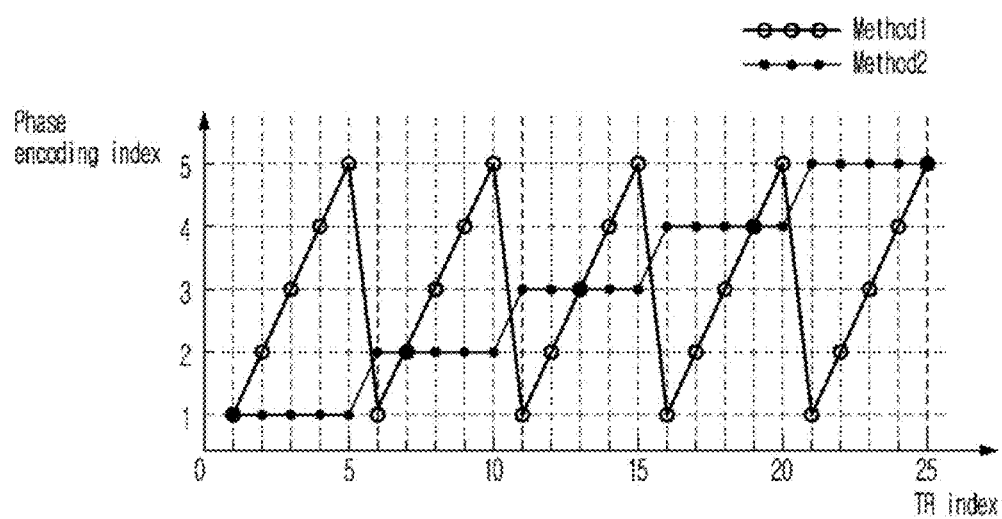
FIG. 9 is a graph illustrating a method of acquiring an echo signal in a retrospective gating method.

FIG. 9 is a graph illustrating a method of acquiring an echo signal in a retrospective gating method.

In a retrospective gating method, a method of repeatedly acquiring echo signals, which correspond to total ky lines constituting a k-space, as a unit, or a method of continuously acquiring echo signals, which correspond to the same ky lines, as a unit, is used.

In a graph of FIG. 9, a vertical axis represents a Y-axis phase encoding index, and a horizontal axis represents a TR index. As illustrated in FIG. 9, when the Y-axis phase encoding index is set as from 1 to 5, respective echo signals for the Y-axis gradient magnetic field having 5 different magnitudes may be acquired, and when the TR index is set to 25, the echo signals may be acquired 25 times.

When applying the method of repeatedly acquiring echo signals, which correspond to the total ky lines constituting the k-space, as a unit, acquiring again echo signals for a Y-axis gradient_1 to a Y-axis gradient_5 after sequentially acquiring echo signals for the Y-axis gradient_1 (a number behind_ represents an index) to the Y-axis gradient_5 is repeated a total of 5 times.

Figure 10:
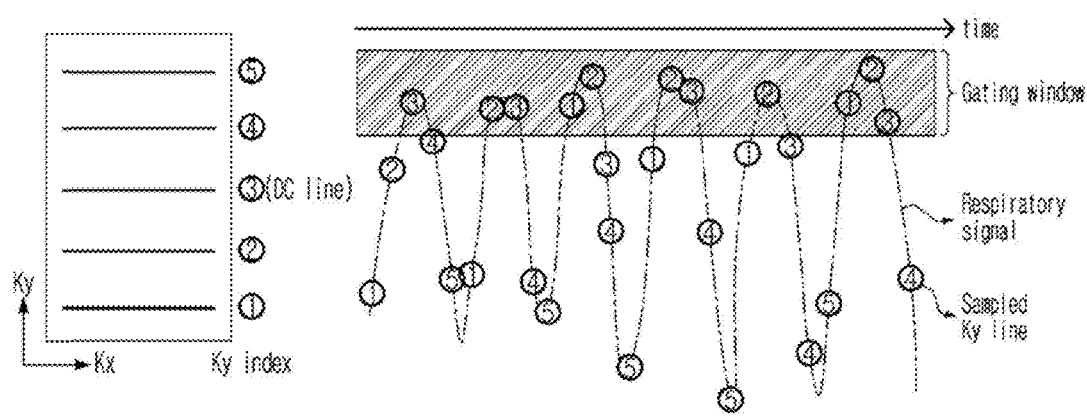
FIG. 10 is a diagram illustrating a process of determining a signal, which is assumed to be acquired in a respiratory condition, when echo signals corresponding to entire ky lines are repeatedly acquired as a unit.

In addition, when applying the method of continuously acquiring echo signals, which correspond to the same ky lines, after an echo signal for a Y-axis gradient_1 is continuously acquired 5 times, an echo signal for a Y-axis gradient_2 is continuously acquired 5 times, and an echo signals for a Y-axis gradient_5 is repeatedly acquired in the same manner FIG. 10 is a diagram illustrating a process of determining a signal, which is assumed to be acquired in a respiratory condition, when echo signals corresponding to entire ky lines are repeatedly acquired as a unit.

As mentioned above, as for a retrospective gating method, data used for an image reconstruction is extracted based on respiration information of a patient measured during scanning. When repeatedly acquiring sequential echo signals from a Y-axis gradient_1 to a Y-axis gradient_5 as a unit, data about a Y-axis gradient 3-2-3-1-2-2-3-2-1-2 is included in gating window so that it is assumed to be acquired in a respiration condition, as illustrated in FIG. 10. Accordingly the data is extracted and is filled in a ky line corresponding to the data.

However, because data about a Y-axis gradient_4 and a Y-axis gradient_5 are not extracted, respective ky line_4 and ky line_5 are not filled. Accordingly, other data in surroundings may be used to fill the ky line_4 and the ky line_5.

In a case of acquiring an echo signal in accordance with a conventional method, even if the echo signal corresponding to the same ky line is acquired multiple times, an echo signal corresponding to a ky line may be acquired to be gathered in a respiration condition. Accordingly, an artifact caused by a movement may still appear in a reconstructed MR image.

Therefore, the MRI apparatus 100 determines an acquisition order and an interval of an echo signal so that echo signal for the same Y-axis gradient magnetic field in a single respiration circle of a patient may be acquired a plurality of times at the same interval. For example, an echo signal corresponding to the same ky line is repeatedly acquired in a single respiration cycle $T_{resp}$ N times (N is an integer of 2 or more), and at a time interval of $T_{resp}/N$. Hereinafter detailed description of a method of acquiring echo signals in an MRI apparatus 100 will be described.

Figure 11:
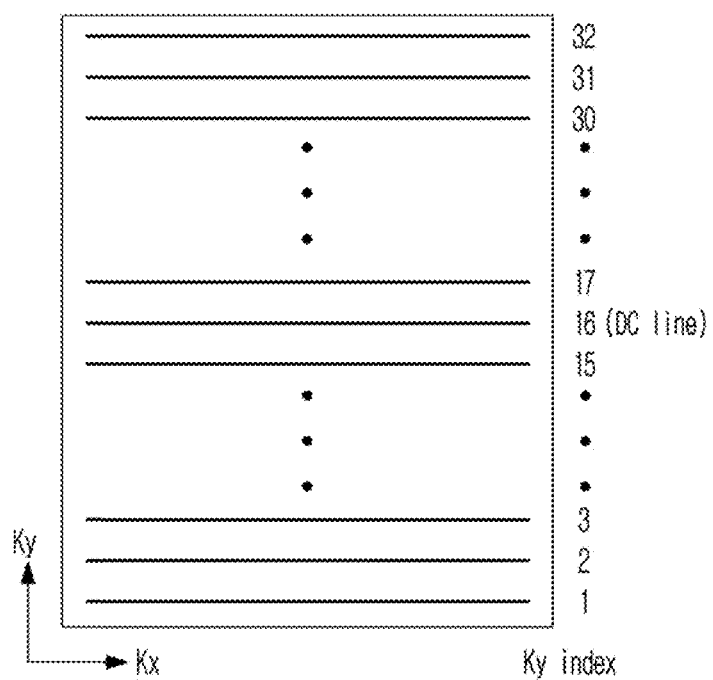
FIG. 11 is a view illustrating a k-space generated in an MRI apparatus according to an exemplary embodiment.
Figure 12:
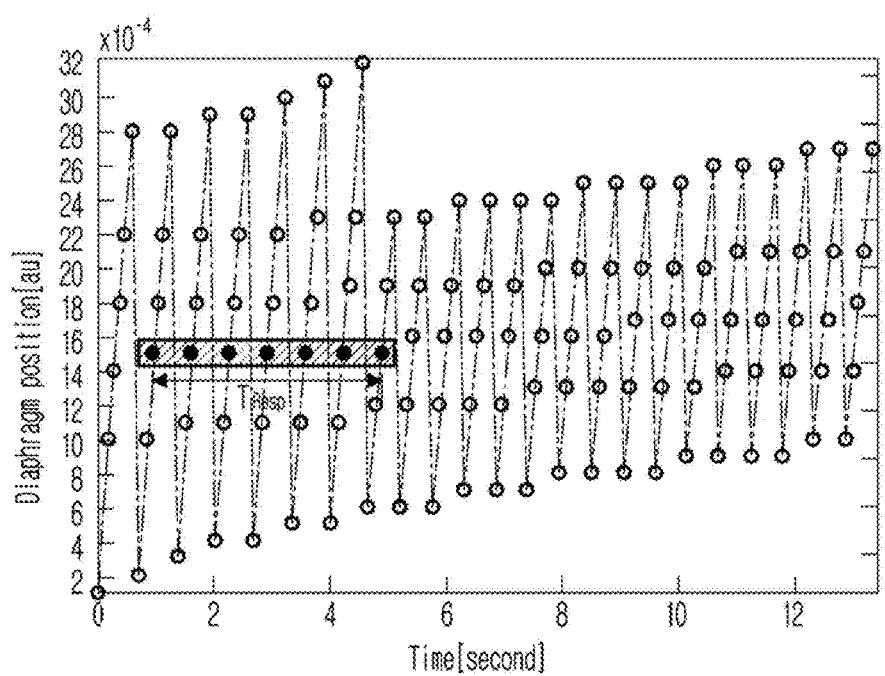
FIG. 12 is a graph illustrating a sequence of acquiring data of an MRI apparatus according to an exemplary embodiment.
Figure 13:
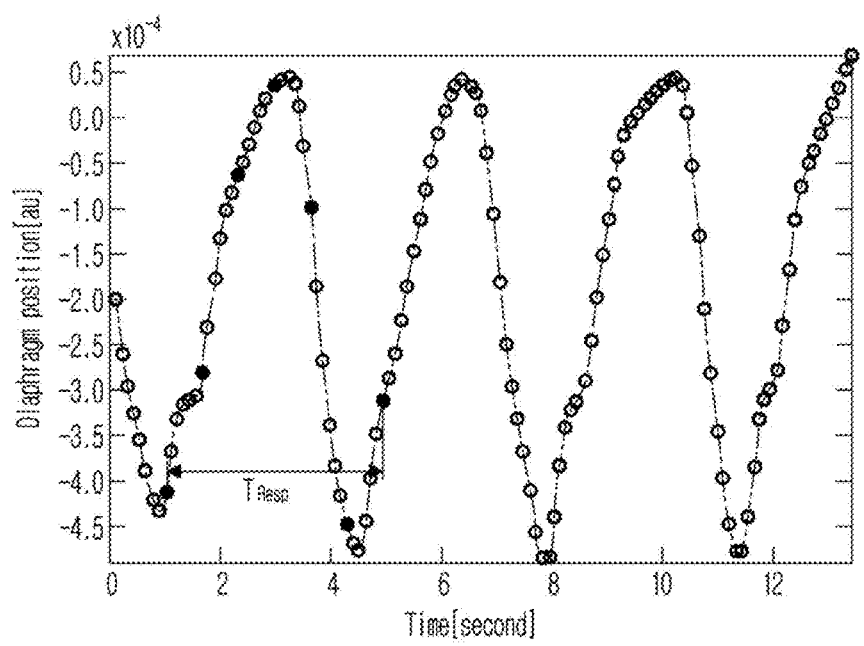
FIG. 13 is a graph illustrating that each data is acquired in a kind of respiratory condition according to an exemplary embodiment.

FIG. 11 is a view illustrating a k-space generated in an MRI apparatus according to an exemplary embodiment, FIG. 12 is a graph illustrating a sequence of acquiring data of an MRI apparatus according to an exemplary embodiment, and FIG. 13 is a graph illustrating that each data is acquired in a kind of respiratory condition according to an exemplary embodiment.

In a case when acquiring echo signals for 32 Y-axis gradient magnetic fields, which are different from each other in magnitude, a k-space composed of 32 ky-lines is formed in the data storage 161, as illustrated in FIG. 11.

The scanner 150 may acquire data according to a Cartesian trajectory. It is assumed that a predetermined respiration cycle $T_{resp}$ of a patient is constant while acquiring data. As illustrated in FIG. 12, data, which is indicated by black dots and corresponds to a ky_15 line in a single respiration cycle $T_{resp}$ of a patient, is acquired 7 times at the same time intervals. Therefore, each of the data of the ky_15 line is acquired at a time interval of $T_{resp}/7$. Here, the data represents a digital signal converted from an MR signal.

In this case, as illustrated in FIG. 13, data corresponding to a ky_15 line may be acquired to be not focused on a respiration condition in a single respiration cycle $T_{resp}$ of a patient, but to be uniformly distributed in different respiration conditions in the single respiration cycle $T_{resp}$. Accordingly it may be expected that at least one data among the acquired data is included in a gating window, e. g., an end expiration.

As mentioned, data corresponding to a rest ky line may be acquired in a single respiration cycle a plurality of times at the same time interval. Accordingly, focusing in a respiration condition may be prevented, and thus a possibility of acquiring data in a desired respiration condition may be increased.

Meanwhile, the scanner 150 may acquire not only data corresponding to the same ky line, but also data corresponding to multiple ky lines in a single respiration cycle $T_{resp}$. However, the scanner 150 may not acquire data corresponding to an adjacent ky line in the single respiration cycle $T_{resp}$, but acquire data corresponding to a ky line having a predetermined distance (i.e., a predetermined difference in magnitude) from the same ky line. Thus, data corresponding to an adjacent ky line may be prevented to be acquired by focusing in a respiration condition.

Here, a distance may represent a distance between ky lines arranged in the k-space, and may be indicated by an index difference or magnitude difference between the ky lines. For example, it may be possible that data acquired in a single respiration cycle becomes data corresponding to a ky line having an index difference of 4 or more, and the index difference may be determined by a number of total ky lines, a total scan time, a TR and the like.

In addition, the scanner 150 may apply a variable density sampling, which is varying a number of repetitions of data acquisition corresponding to a respective ky line, to improve an efficiency of the acquisition data.

As a Y-axis magnetic field is weak, a strength of an echo signal becomes stronger. Therefore, data filled in a center of the k-space may determine an entire contrast of an image. The scanner 150 may more repeatedly acquire data corresponding to a ky line placed in the center of the k-space, than data placed in an edge portion of the k-space. A number of each data repeatedly acquired may be determined to be inversely proportional to a distance from the center of the k-space to the corresponding ky line. Data corresponding to a ky line placed at a distance from the center may be repeatedly acquired N times, and data corresponding to a rest ky line may be acquired once.

The above-mentioned data acquisition method may be applied to a three-dimensional Cartesian trajectory. The method is sequentially applying a data acquisition order and a number applied to a two-dimensional Cartesian trajectory to a slice direction (a Z-axis). That is, as mentioned above, as for each kz line, data is acquired according to the two-dimensional Cartesian trajectory and a slice is increased to fill each kz line.

As for a kz line, a variable density sampling is applied so that data acquisition time may be reduced. A number of each data acquisition may be determined to be inversely proportional to a distance from a center of a 3D k-space.

When applying to the 3D Cartesian trajectory, data corresponding to the same ky line in a single respiration cycle of a patient may be acquired a plurality of times, but data corresponding to an adjacent ky line may be dispersed to be not acquired. In addition, data corresponding to the same ky line in the single respiration cycle of a patient may be acquired at a plurality of times, but data corresponding to adjacent ky line may be dispersed to be not acquired.

The data processor 164 may extract and classify acquired data according to a respiration condition of a patient indicated during scanning. For this, patient respiration information may be acquired. The patient respiration information may be acquired by various methods, such as a method of using a sensor, a navigator echo method, or a self-navigator method.

As for using a sensor, it is a method to estimate a motion according to a respiration by acquiring a degree of expansion or contraction of a chest wall from a sensor when a patient wears a belt or bellows, to which a pressure sensor is mounted, on a chest below thereof.

Figure 14:
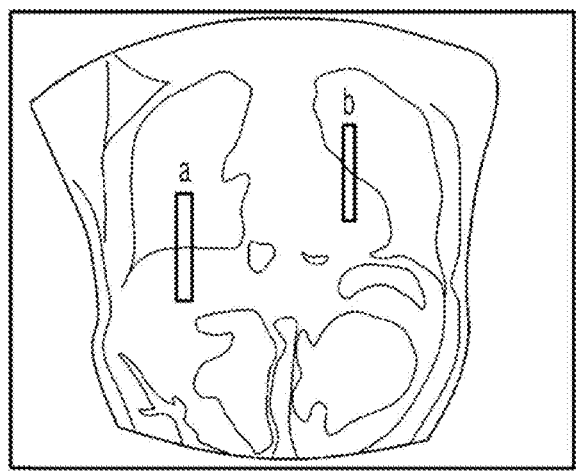
FIG. 14 is a view illustrating an area where a navigator echo is acquired according to an exemplary embodiment.

FIG. 14 is a view illustrating an area where a navigator echo is acquired according to an exemplary embodiment.

A navigator echo method is a method of directly observing a movement of an organ generated by a respiration through an MR image by alternately acquiring image data and navigator echo data to observe a movement in a single TR.

In an MR image, a boundary between lungs and a liver has a large contrast, and a movement of respiration directly appears on the boundary. Therefore, as illustrated in FIG. 14, navigator echo data may be acquired on a boundary b between the lungs and the liver, or around a right diaphragm a.

The navigator echo data may be acquired in a one-dimensional image or a two-dimensional image. When the navigator echo data is a one-dimensional image, a 90 degree RF and an 180 degree RF are applied to different slices from each other, and an overlapped area between the two slices is formed in a shape of pencil beam to include the diaphragm so that the movement caused by the respiration may be observed. When the navigator echo data is a two-dimensional image, the movement caused by the respiration may be observed by acquiring an image of low resolution on a diaphragm boundary portion by using a pulse sequence having a high-speed data acquisition time.

A self navigator method is a method of extracting information, which is used to identify a movement caused by a respiration, from image data without acquiring additional navigator echo data for an observation of the movement. There are various kinds of methods of extracting information to identify the movement caused by the respiration, but a representative method is a method using that a movement of organs caused by the respiration changes a size of a center point of a k-space or a phase value.

As for a radial trajectory sequence, each sampling line performs sampling of a center point of a k-space so that information of a movement caused by respiration is extracted by using sampled data without changing an additional sequence. As for a Cartesian trajectory, the center point of the k-space is repeatedly sampled by a little changing sequence so that the information of the movement caused by the respiration is extracted.

The MRI apparatus 100 may acquire information about a respiration condition of a patient by using one of the above-described methods, but it is possible to acquire the information by another method in addition to the above-described methods. That is, the above-described methods are only examples that may be applied to the MRI apparatus 100, but is not limited thereto.

Referring to FIG. 13 again, the data processor 164 may determine data included in a predetermined gating window based on respiration information of a patient measured by one of the above-described methods, may extract the data included in the gating window, and then may fill a ky line corresponding to the extracted data in a k-space, as illustrated in FIG. 11.

As mentioned above, when echo signals corresponding to the same ky line in a single respiration is acquired a plurality of times at the same time interval, as illustrated in FIG. 13, at least one of the acquired echo signals may be included in a gating window, i.e., an end expiration. When a plurality of echo signals is included in the gating window, an average of the plurality of echo signals may fill a k-space. When a ky line without data included in the gating window exists, even low probability, data, which is acquired in a closest respiration condition to the gating window, among data corresponding to a ky line may be used, or an interpolation method may be applied to data filled in the k-space already.

Meanwhile, the data processor 164 may classify the acquired data according to a plurality of respiration conditions, and may use the classified data to generate a dynamic MRI. Hereinafter detailed description thereof will be described.

Figure 15:
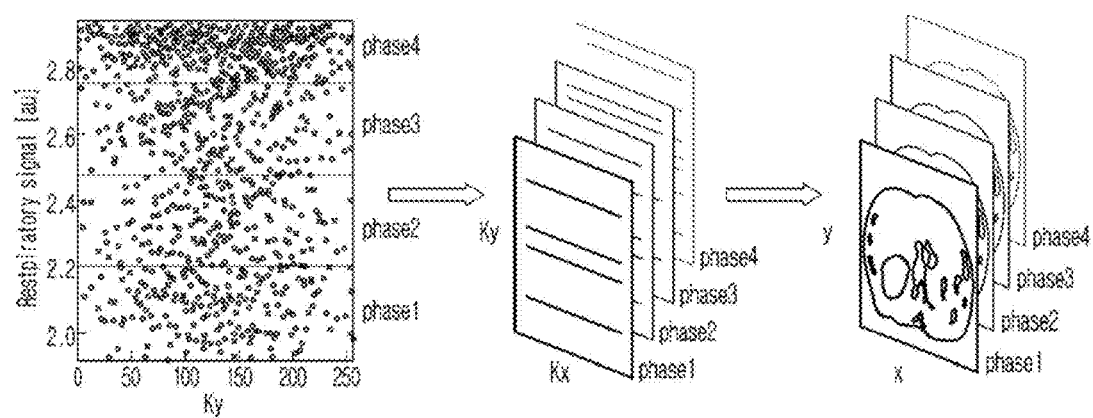
FIG. 15 is a view schematically illustrating a process of generating a dynamic MRI by applying a compressed sensing reconstruction technique to data classified based on respiration information according to an exemplary embodiment.

FIG. 15 is a view schematically illustrating a process of generating a dynamic MRI by applying a compressed sensing reconstruction technique to data classified based on respiration information according to an exemplary embodiment.

As mentioned above, when data corresponding to a plurality of ky lines that are not adjacent in a k-space is repeatedly acquired in a single respiration cycle, data corresponding to the total ky lines of the k-space may be randomly distributed in all respiration conditions, as illustrated in a left side of FIG. 15.

The data processor 164 classifies data according to several representative respiration conditions, e.g., 4 phase respiration conditions, such as phase 1, phase 2, phase 3, and phase 4, as illustrated in the left side of FIG. 15.

The data processor 164 performs retrospective gating in which each respiration condition is considered as a gating window by filling a k-space corresponding to the corresponding respiration condition with data included in each respiration condition. In detail, a k-space corresponding to the phase 1 is filled by using data included in the phase 1, a k-space corresponding to the phase 2 is filled by using data included in the phase 2, a k-space corresponding to the phase 3 is filled by using data included in the phase 3, and a k-space corresponding to the phase 4 is filled by using data included in the phase 4. This is a result of a compressed sensing.

In the compressed sensing, undersampling is randomly performed to increase a time resolution. The data processor 164 classifies data according to a phase of respiration, and fills a single k-space with echo signals included in the same phase, thereby supplying a result of random undersampling, as illustrated in FIG. 15.

The image processor 163 acquires a dynamic MRI by reconstructing k-space data of FIG. 15. Conventional methods may be used to acquire the dynamic MRI, or a sparsifying transformation may be used as a Fourier transform of a time-axis by using that an image has a periodicity with respect to a time t. However, the image processor 163 may apply a finite difference in a phase direction by using that a phase of respiration has a one-way direction from expiration to inspiration.

Hereinafter, exemplary embodiments of a control method of an MRI apparatus will be described. The control method of the MRI apparatus may be applied to the MRI apparatus 100, and the description of FIGS. 1 to 15 may be applied to the control method of the MRI apparatus.

Figure 16:
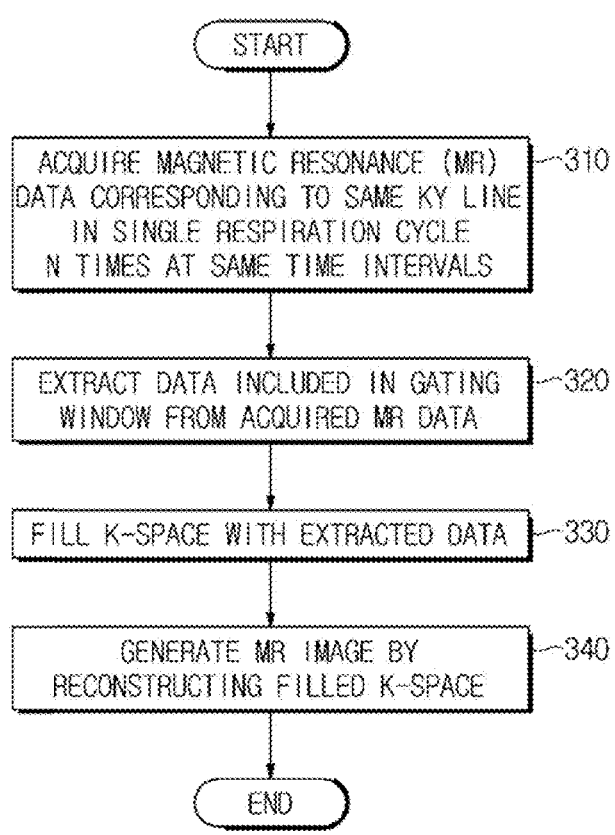
FIG. 16 is a flowchart of a control method of an MRI apparatus according to an exemplary embodiment.

FIG. 16 is a flowchart of a control method of an MRI apparatus according to an exemplary embodiment.

Referring to FIG. 16, in operation 310, MR data corresponding to the same ky line in a single respiration cycle $T_{resp}$ is acquired N times at the same time intervals. Here, N is an integer of 2 or more, and for example, the MR data corresponding to the same ky line in the single respiration cycle $T_{resp}$ may be acquired 5~10 times at the same time intervals. In addition, the single respiration cycle may be estimated before scanning.

In addition, data corresponding to various ky lines may be acquired. However, data corresponding to an adjacent ky line in the single respiration cycle $T_{resp}$ may not be acquired, but data corresponding to a ky line having a distance from the same ky line. Thus, the data corresponding to the adjacent ky line may be prevented to be acquired by focusing on a respiration condition.

In addition, an efficiency of the acquisition data may be improved by applying a variable density sampling, which is varying a number of repetition of data acquisition from a respective ky line. For example, data corresponding to a ky line placed in a center of a k-space may be more repeatedly acquired than data placed in an edge portion of the k-space.

In operation 320, data included in a gating window is extracted from the acquired MR data. For this, patient respiration information is measured during scanning, and the data included in the gating window is extracted by synchronizing the patient respiration information with time of the MR data. The gating window represents a respiration condition. For example, an end expiration may be referred to as the gaiting window. Meanwhile, the patient respiration information may be acquired by at least one of various methods, such as a method by using a sensor, a navigator echo method, and a self-navigator method.

In operation 330, a k-space is filled with the extracted data. For example, when data corresponding to a ky_15 line in the single respiration cycle $T_{resp}$ is acquired 7 times at the same time intervals, as illustrated in FIG. 12, at least one of the data corresponding to the ky_15 line may be included in the gating window and filled in the k-space, and data corresponding to remaining ky lines may be acquired in the same manner to fill the k-space, as illustrated in FIG. 13.

In operation 340, an MR image is generated by reconstructing data of the filled k-space. An inverse Fourier transformation may be used to reconstruct the k-space data.

Figure 17:
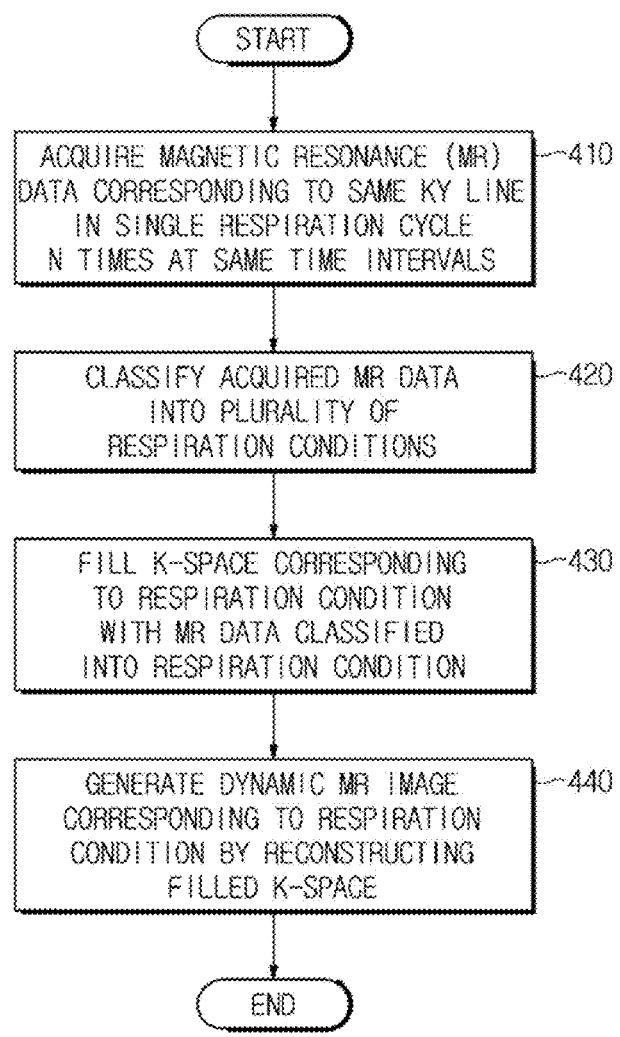
FIG. 17 is a flowchart of a method of generating a dynamic MR image in a control method of an MRI apparatus according to an exemplary embodiment.

FIG. 17 is a flowchart of a method of generating a dynamic MR image in a control method of an MRI apparatus according to an exemplary embodiment.

Referring to FIG. 17, in operation 410, MR data corresponding to the same ky line in a single respiration cycle is acquired N times at the same intervals. A description thereof is the same as that of operation 310 of FIG. 16.

In operation 420, the acquired MR data is classified into a plurality of respiration conditions. As mentioned above, when data corresponding to a plurality of ky lines, which are not adjacent in a k-space is repeatedly acquired in a single respiration cycle, data corresponding to the entire ky lines of the k-space may be randomly distributed in all respiration conditions, as illustrated in the left side of FIG. 15. For example, as illustrated in FIG. 15, the data randomly distributed may be classified according to 4 respiration conditions, such as phase 1, phase 2, phase 3, and phase 4.

In operation 430, the k-space corresponding to a respiration condition is filled with MR data classified into the respiration condition. For example, a k-space corresponding to the phase 1 may be filled by using data included in the phase 1, a k-space corresponding to the phase 2 may be filled by using data included in the phase 2, a k-space corresponding to the phase 3 may be filled by using data included in the phase 3, and a k-space corresponding to the phase 4 may be filled by using data included in the phase 4. This is a result of a compressed sensing.

In operation 440, a dynamic MR image corresponding to the respiration condition is generated by reconstructing data of the filled k-space corresponding to the respiration condition. A finite difference transformation may be applied in a phase direction based on a fact that a phase of respiration has a one-way direction from expiration to inspiration.

Figure 18:
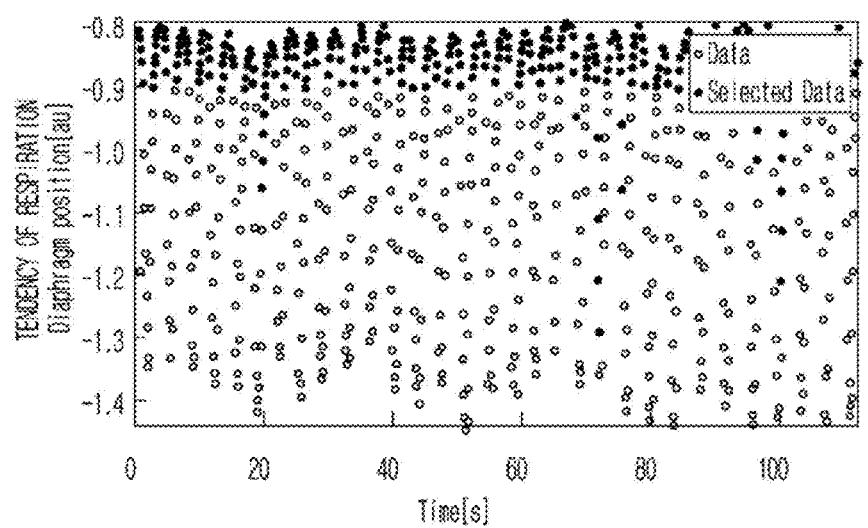
FIGS. 18 and 19 are graphs of experimental results of acquiring data in a way that data corresponding to entire ky lines is repeatedly acquired as a unit.
Figure 19:
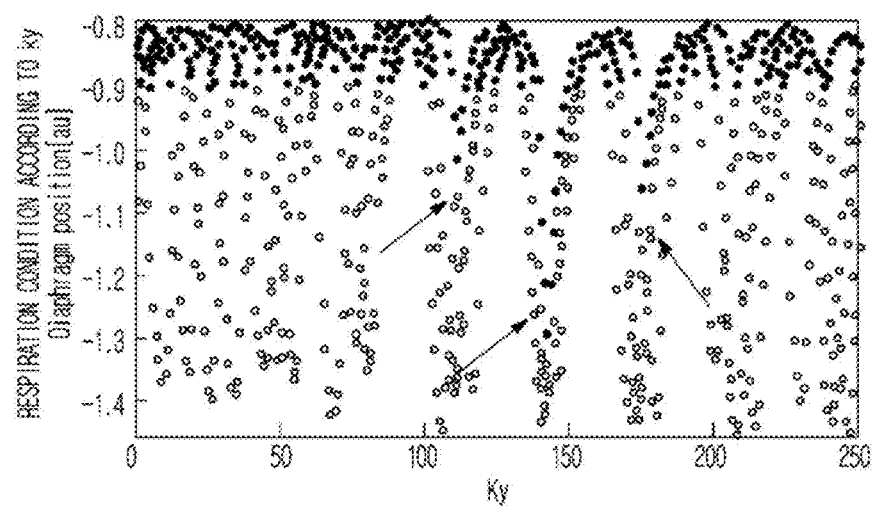
Figure 20:
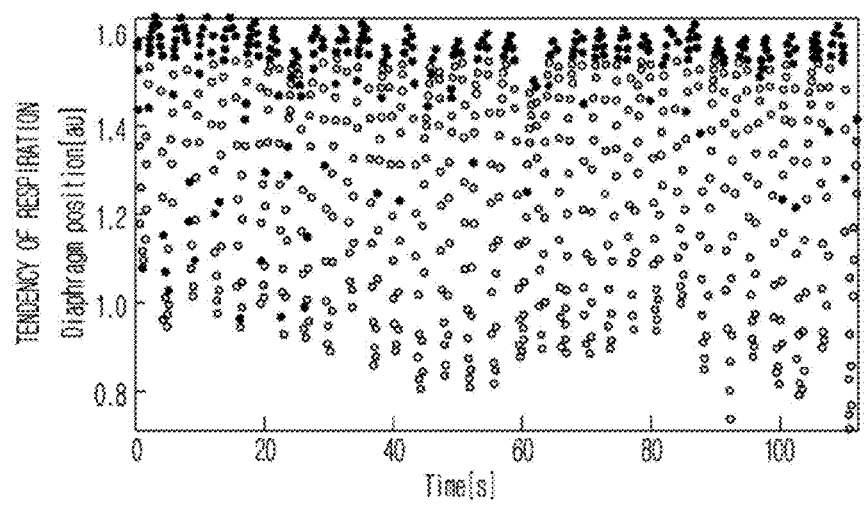
FIGS. 20 and 21 are graphs of experimental results of acquiring data according to a control method of an MRI apparatus according to exemplary embodiments.
Figure 21:
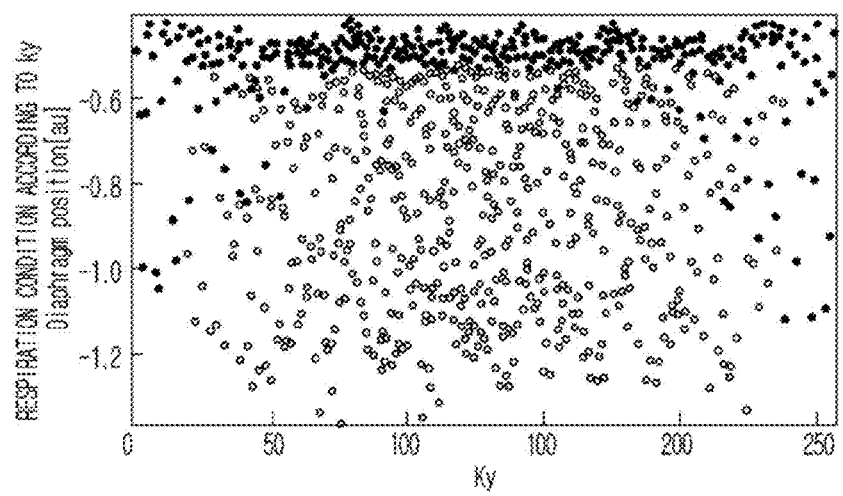

FIGS. 18 and 19 are graphs of experimental results of acquiring data in a way that data corresponding to entire ky lines is repeatedly acquired as a unit, and FIGS. 20 and 21 are graphs of experimental results of acquiring data according to a control method of an MRI apparatus according to an exemplary embodiment.

TR/TE=110 ms/8.1 ms, Tresp=4s, and scan efficiency=25% are applied both experiments.

FIGS. 18 and 20 illustrate patient respiration conditions measured while acquiring MR data. Referring to FIGS. 18 and 20, a patient respiratory tendency according to time is shown to be similar in two experiments. An upper portion of the graph, i.e., an expiration condition, is set to be a gating window.

Referring to a respiration condition according to a ky line, as illustrated in FIG. 19, data corresponding to a ky line placed in a center of a k-space is focused on a respiration condition away from a gating window, thereby generating an artifact in an MR image.

Referring to a respiration condition according to a ky line, as illustrated in FIG. 21, data corresponding to entire ky lines may be randomly distributed on various respiration conditions, e.g., data corresponding to a ky line placed in a center of a k-space may be placed in a gating window. Therefore, an MR image having excellent resolution may be acquired.

Figure 22:
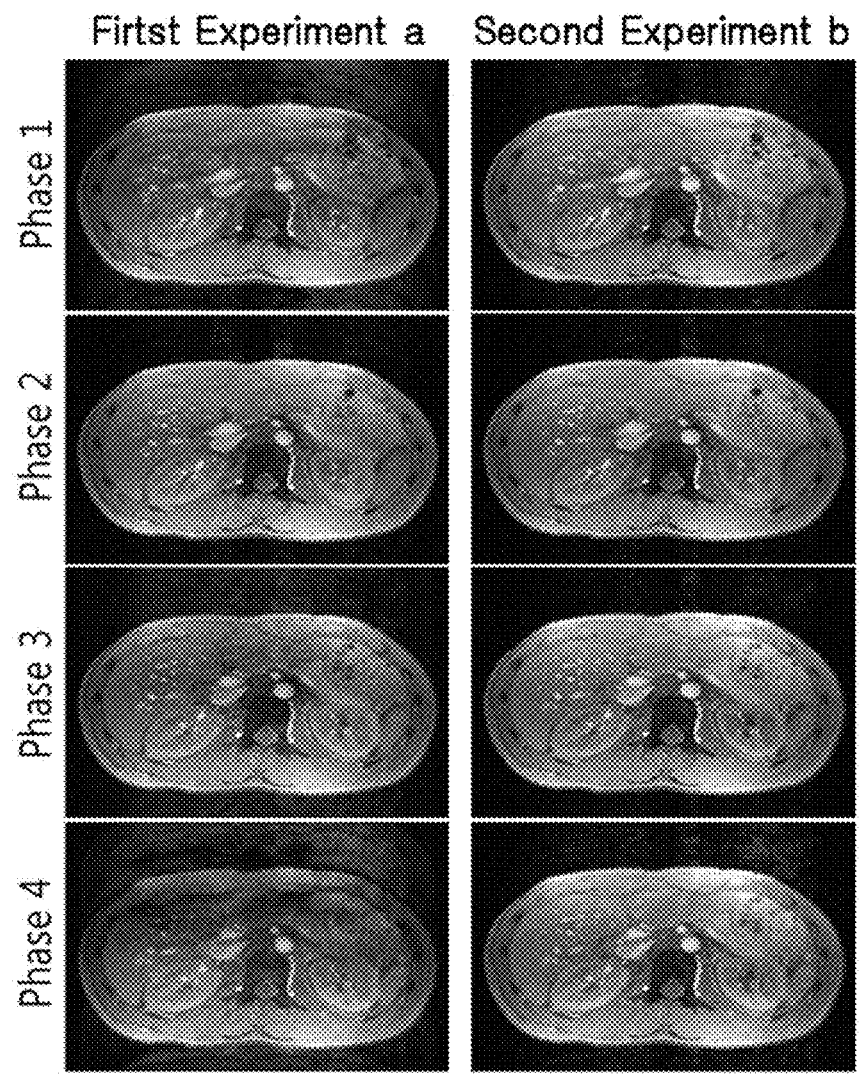
FIG. 22 is a view comparing an MR image generated by applying a compressed sensing technique when reconstructing an image with an MR image generated by otherwise, in which both MR images are acquired by a control method of an MRI apparatus according to an exemplary embodiment.

FIG. 22 is a view comparing an MR image generated by applying a compressed sensing technique when reconstructing an image with an MR image generated by otherwise, in which both MR images are acquired by a control method of an MRI apparatus according to an exemplary embodiment.

TR/TE=55 ms/8.1 ms, flip angle=15 degree, Matrix size=256×512, FOV=300×300 mm², Tresp=4s, scan efficiency=25% are applied to both experiments.

Acquired MR data may be classified according to 4 respiration conditions, such as phase 1, phase 2, phase 3, and phase 4. In a first experiment a, an MR image is independently reconstructed by each phase by filling data in each phase, which is not filled, with data of an adjacent phase.

In a second experiment b, an MR image is reconstructed by using sparse in a k-phase direction and by applying an above-mentioned compressed sensing technique.

As a result of comparing the image acquired from the two experiments, in the MR image reconstructed corresponding to each phase in the first experiment a, an artifact is displayed on an area besides in vivo, as illustrated in FIG. 22. In the MR image reconstructed corresponding to each phase in the second experiment b, an artifact is not displayed.

Therefore, it may be confirmed that a dynamic MR image having excellent resolution may be acquired by applying finite difference transformation in a phase direction based on a fact that a respiration phase is moved in a one-way direction from inspiration to expiration, after the acquired MR data is classified according to respiration phases.

According to the exemplary embodiments of the MRI apparatus and the control method thereof, because data for a plurality of respiration phases is randomly sampled, it may be possible to prevent an amount of data acquired at a time when a movement on a periodic variation of a respiration is largely changed, from being relatively increased. In addition, because the acquired data is undersampled based on a compressive sensing technique used to generate a dynamic MR image, various techniques used in the compressive sensing technique may be utilized. Accordingly, an artifact of an image may be minimized, and images of a plurality of respiration phases may be simultaneously reconstructed.

As is apparent from the above description, according to an aspect of an MRI apparatus and a control method thereof, data is firstly acquired, data is determined to fill a k-space, and a number and an order of the data acquisition are randomly determined in consideration of a respiration cycle of a patient so that an efficiency of the data acquisition may be improved and an influence of the patient respiration may be reduced.

In addition, the exemplary embodiments may also be implemented through computer-readable code and/or instructions on a medium, e.g., a non-transitory computer-readable medium, to control at least one processing element to implement any above-described embodiments. The medium may correspond to any medium or media which may serve as a storage and/or perform transmission of the computer-readable code.

The computer-readable code may be recorded and/or transferred on a medium in a variety of ways, and examples of the medium include recording media, such as magnetic storage media (e.g., ROM, floppy disks, hard disks, etc.) and optical recording media (e.g., compact disc read only memories (CD-ROMs) or digital versatile discs (DVDs)), and transmission media such as Internet transmission media. Thus, the medium may have a structure suitable for storing or carrying a signal or information, such as a device carrying a bitstream according to one or more exemplary embodiments. The medium may also be on a distributed network, so that the computer-readable code is stored and/or transferred on the medium and executed in a distributed fashion. Furthermore, the processing element may include a processor or a computer processor, and the processing element may be distributed and/or included in a single device.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A magnetic resonance imaging (MRI) apparatus comprising:
a scanner;
a controller configured to:
control the scanner to receive an N (N is an integer of 2 or more) number of magnetic resonance (MR) signals corresponding to a magnitude of a y-axis gradient magnetic field, for the y-axis gradient magnetic field in a single respiration cycle of a patient at a same interval; and
control the scanner to further receive MR signals for a plurality of y-axis gradient magnetic fields having different magnitudes from the y-axis gradient magnetic field in the single respiration cycle; and
a processor configured to:
extract an MR signal that is received in a respiration condition of the patient, from the MR signals that are received;
fill a k-space with the MR signal that is extracted; and
generate an MR image by reconstructing data of the k-space that is filled.

2. The MRI apparatus of claim 1, wherein the plurality of y-axis gradient magnetic fields corresponding to the MR signals received in the single respiration cycle has a difference equal to or larger than a reference magnitude.

3. The MRI apparatus of claim 1, wherein the controller is further configured to control the N number of the MR signals that are received in the single respiration cycle, to be variable according to the magnitude of the y-axis gradient magnetic field.

4. The MRI apparatus of claim 3, wherein the controller is further configured to increase the N number of the MR signals received in the single respiration cycle as the magnitude of the y-axis gradient magnetic field is smaller.

5. The MRI apparatus of claim 3, wherein the controller is further configured to control the N number of the MR signals received in the single respiration cycle to be inversely proportion to the magnitude of the y-axis gradient magnetic field.

6. The MRI apparatus of claim 1, wherein the controller is further configured to keep a Repetition Time (TR) to be constant.

7. The MRI apparatus of claim 1, wherein the processor is further configured to extract the MR signal received in the respiration condition, from the MR signals that are received, based on respiration information of the patient measured while the MR signals are being received.

8. The MRI apparatus of claim 7, wherein the respiration information is measured by at least one among a respiratory bellows, a navigator echo method, and a self-navigator method.

9. The MRI apparatus of claim 1, wherein the processor is further configured to:
classify the MR signals that are received, according to a plurality of respiration conditions; and generate k-space data corresponding to a plurality of respiration conditions by filling the k-space corresponding to the plurality of respiration conditions with the MR signals that are classified.

10. The MRI apparatus of claim 9, wherein the processor is further configured generate an MR image corresponding to the plurality of respiration conditions by reconstructing the k-space data corresponding to the plurality of respiration conditions, using an image reconstruction technique applicable to a compressive sensing.

11. The MRI apparatus of claim 1, wherein the N number of the MR signals is greater than or equal to 5 and less than or equal to 10.

12. A control method of a magnetic resonance imaging (MRI) apparatus, the method comprising:
controlling a scanner to receive an N (N is an integer of 2 or more) number of magnetic resonance (MR) signals corresponding to a magnitude of a y-axis gradient magnetic field, for the y-axis gradient magnetic field in a single respiration cycle of a patient at a same interval;
controlling the scanner to further receive MR signals for a plurality of y-axis gradient magnetic fields having different magnitudes from the y-axis gradient magnetic field in the single respiration cycle;
extracting an MR signal that is received in a respiration condition of the patient, from the MR signals that are received;
filling a k-space with the MR signal that is extracted; and
generating an MR image by reconstructing data of the k-space that is filled.

13. The control method of claim 12, wherein the plurality of y-axis gradient magnetic fields corresponding to the MR signals received in the single respiration cycle has a difference equal to or larger than a reference magnitude.

14. The control method of claim 12, further comprising controlling the N number of the MR signals that are received in the single respiration cycle, to be variable according to the magnitude of the y-axis gradient magnetic field.

15. The control method of claim 14, wherein the controlling the N number of the MR signals comprises increasing the N number of the MR signals received in the single respiration cycle as the magnitude of the y-axis gradient magnetic field is smaller.

16. The control method of claim 14, wherein the controlling the N number of the received MR signals comprises controlling the N number of the MR signals received in the single respiration cycle to be inversely proportion to the magnitude of the y-axis gradient magnetic field.

17. The control method of claim 12, further comprising:
classifying the MR signals that are received, according to a plurality of respiration conditions; and
generating k-space data corresponding to a plurality of respiration conditions by filling the k-space corresponding to the plurality of respiration conditions with the MR signals that are classified.

18. The control method of claim 17, further comprising generating an MR image corresponding to the plurality of respiration conditions by reconstructing the k-space data corresponding to the plurality of respiration conditions, using an image reconstruction technique applicable to a compressive sensing.

* * * * *